United States Patent
Chaput et al.

(10) Patent No.: US 11,747,906 B2
(45) Date of Patent: Sep. 5, 2023

(54) GESTURE DETECTION USING PIEZO-ELECTRIC ACTUATORS

(71) Applicant: Boréas Technologies Inc., Bromont (CA)

(72) Inventors: Simon Chaput, Magog (CA); Guillaume Chauvette, Montréal (CA)

(73) Assignee: Boréas Technologies Inc., Bromont (CA)

( * ) Notice: Subject to any disclaimer, the term of this patent is extended or adjusted under 35 U.S.C. 154(b) by 0 days.

(21) Appl. No.: 17/740,647

(22) Filed: May 10, 2022

(65) Prior Publication Data
US 2022/0365603 A1    Nov. 17, 2022

Related U.S. Application Data

(60) Provisional application No. 63/188,634, filed on May 14, 2021.

(51) Int. Cl.
| | | |
|---|---|---|
| G06F 3/01 | (2006.01) | |
| G06F 3/02 | (2006.01) | |
| G06F 3/041 | (2006.01) | |
| B06B 1/06 | (2006.01) | |

(52) U.S. Cl.
CPC ............ G06F 3/016 (2013.01); B06B 1/0622 (2013.01); G06F 3/02 (2013.01); G06F 3/0414 (2013.01)

(58) Field of Classification Search
CPC .......... G06F 3/016; G06F 3/02; G06F 3/0414; G06F 1/1626; G06F 1/1684; G06F 1/1692; G06F 3/04883; B06B 1/0622; H03K 17/964; H04M 1/026; H04M 1/236
See application file for complete search history.

(56) References Cited

U.S. PATENT DOCUMENTS

| | | | | |
|---|---|---|---|---|
| 2007/0236450 A1* | 10/2007 | Colgate | ................... | G06F 3/041 |
| | | | | 345/156 |
| 2011/0167391 A1* | 7/2011 | Momeyer | ............... | G06F 3/038 |
| | | | | 715/863 |
| 2015/0169059 A1 | 6/2015 | Behles et al. | | |
| 2016/0334871 A1* | 11/2016 | Levesque | ............. | G06F 1/1632 |

(Continued)

OTHER PUBLICATIONS

International Search Report dated Aug. 10, 2022, in respect of corresponding PCT International Patent Application No. PCT/CA2022/050734.

Primary Examiner — Temesghen Ghebretinsae
Assistant Examiner — Ivelisse Martinez Quiles
(74) Attorney, Agent, or Firm — Stratford Group Ltd.

(57) ABSTRACT

A gesture detection system comprising a virtual button structure for mounting in an outer frame of a mobile device for detecting finger gestures by a user. First and second piezo-electric actuators are in contact with the virtual button structure, and configured to generate first and second varying electrical signals, respectively in response to a dynamic force application to the virtual button structure. A processor is configured to execute instructions stored in memory to i) determine a magnitude and a position of the dynamic force application on the virtual button structure over time, based on the first varying electrical signal and the second varying electrical signal, ii) determine a gesture corresponding to the magnitude and the position of the dynamic force application over time; and iii) provide a response signal based on the gesture.

19 Claims, 18 Drawing Sheets

(56) References Cited

U.S. PATENT DOCUMENTS

2018/0329494 A1* 11/2018 Hernandez Santisteban ............... G06F 3/016
2019/0107902 A1    4/2019 Kao
2020/0396322 A1* 12/2020 Park .................... H04M 1/0266

* cited by examiner

FIG. 4A
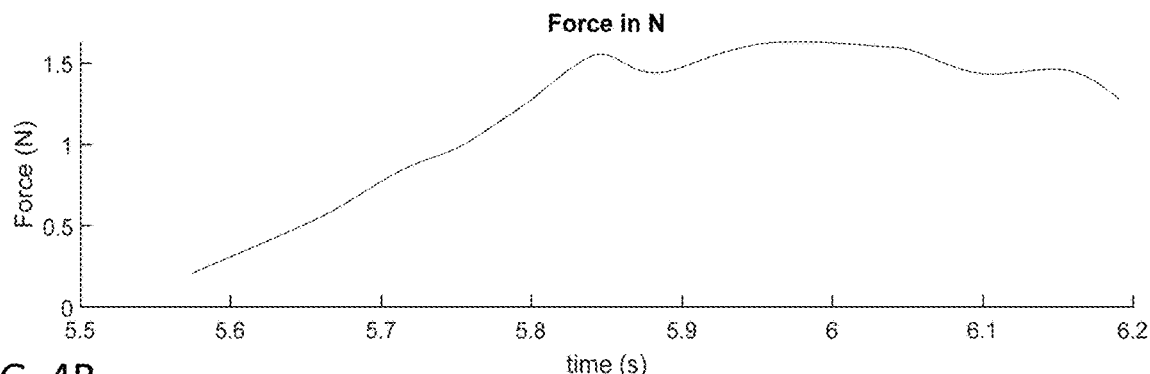
FIG. 4B
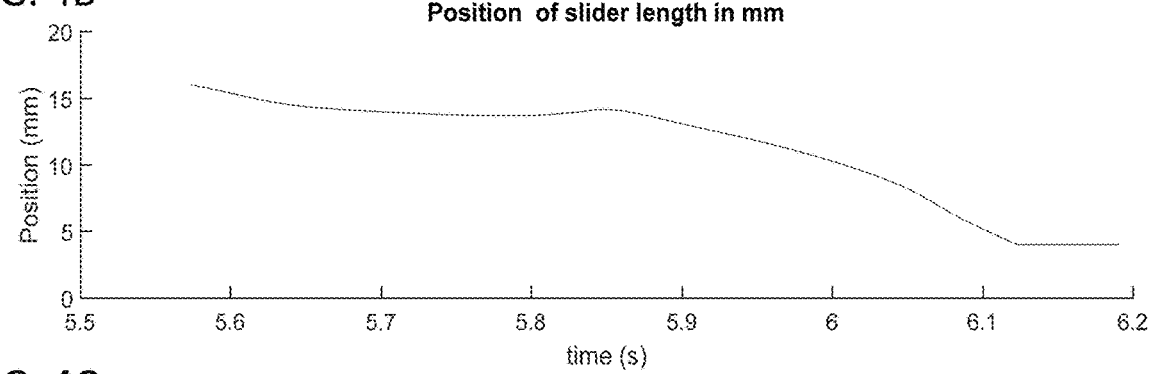
FIG. 4C
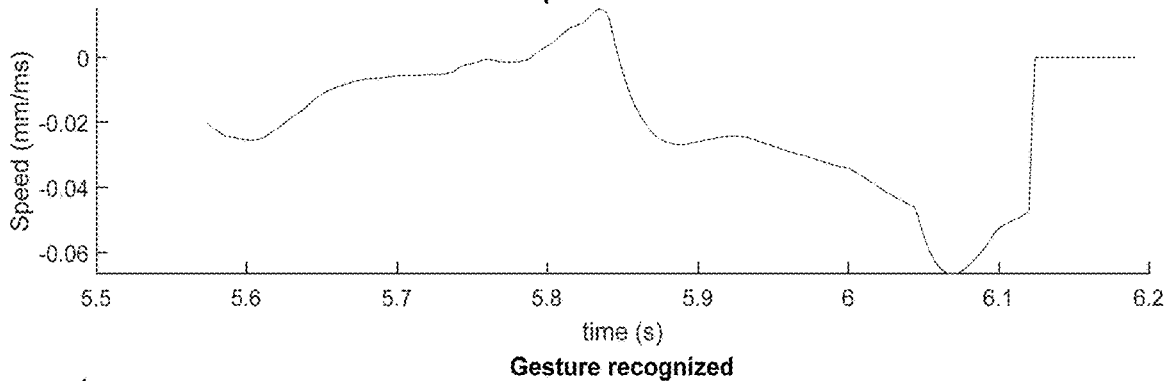
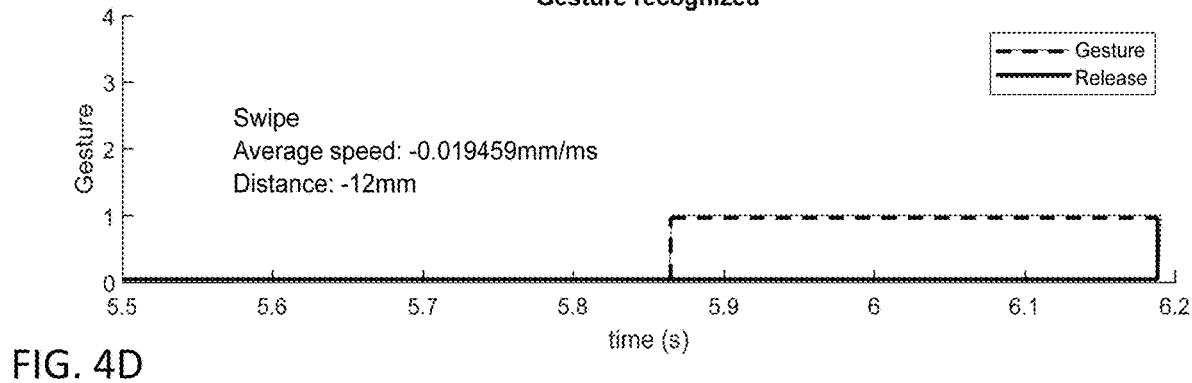
FIG. 4D

GESTURE DETECTION USING PIEZO-ELECTRIC ACTUATORS

TECHNICAL FIELD

The present disclosure relates to a gesture detection and recognition system, and in particular to a gesture detection and recognition system using a plurality of piezo-electric actuators.

BACKGROUND

The interaction with the side of smartphones is fairly limited due to the standardization around conventional mechanical buttons. In the past few years, several sensing only solutions have been proposed to enhance the user experience by replacing buttons with sensors enabling the detection of gestures, such as a swipe. However, these sensing only solutions lacked the localized haptic feedback of a conventional mechanical button, making the device hard to use and not pleasant to the user.

Prior art devices, such as those disclosed in U.S. Pat. No. 10,698,528 issued Jun. 30, 2020, to Lynn et al, enable touch detection on a surface, as well as providing a localized haptic response. However, in those systems, several remote transmitters and receivers are required for transmitting and receiving haptic signals, thereby increasing the number of necessary component. Moreover, the systems are performing active sensing, which means that the signals must be transmitted and received to achieve touch detection, thus consuming power and increasing complexity.

An object of the present disclosure is to provide mechanical integration, a driving and sensing circuit, and software algorithms to provide a solution that enables gesture detection and provides localized haptic feedback with a system based on passive sensing of a minimum of two piezo-electric actuators.

SUMMARY

Accordingly, a first apparatus includes a gesture detection system comprising: a virtual button structure for mounting in an outer frame of a mobile device; a first piezo-electric actuator in contact with the virtual button structure configured to generate a first varying electrical signal in response to a dynamic force application to the virtual button structure; a second piezo-electric actuator in contact with the virtual button structure configured to generate a second varying electrical signal in response to the dynamic force application to the virtual button structure; a processor; and a first memory storing instructions.

The instructions, when executed by the processor, are configured to: i) determine magnitude and position of the dynamic force application on the virtual button structure over time, based on the first varying electrical signal and the second varying electrical signal, ii) determine a gesture corresponding to the magnitude and the position of the force application over time; and iii) provide a response signal based on the gesture.

The position of the dynamic force application may be determined based on a relative value of the first electrical signal and the second electrical signal.

According to some embodiments, the position of the dynamic force application may be determined based on changes in the first electrical signal and the second electrical signal over time.

According to some embodiments, the processor may be configured to determine a change in position of the force application on the virtual button.

According to some embodiments, the change in position of the force application may be determined based on a relative value of the first electrical signal and the second electrical signal over time.

According to some embodiments, the change of position of the force application may be based on changes in the first electrical signal and the second electrical signal over time.

According to some embodiments, the response signal may comprise a haptic activation signal to the first piezo-electric actuator and/or the second piezo-electric actuator for generating a haptic response thereon based on the gesture.

According to some embodiments, the response signal may comprise a display activation signal for generating a response on a display of the mobile device based on the gesture.

According to some embodiments, the response signal may comprise a volume activation signal for adjusting a volume of a speaker of the mobile device based on the gesture.

According to some embodiments, when the magnitude of the first varying electrical signal is substantially equal to the magnitude of the second varying electrical signal, the processor may be configured to determine that the gesture comprises a stationary force application in between the first piezo-electric actuator and the second piezo-electric actuator.

According to some embodiments, when the magnitude of the first varying electrical signal is at least 2× the magnitude of the second varying electrical signal and a ratio therebetween is substantially constant, the processor may be configured to determine that the gesture comprises a stationary force application over the first piezo-electric actuator.

According to some embodiments, when the first varying electrical signal increases from a first magnitude to a second greater magnitude and the second varying electrical signal decreases from a third magnitude to a fourth lesser magnitude, the processor may be configured to determine that the gesture comprises a moving force application across the virtual button structure.

According to some embodiments, the memory may include a table of different force applications or gestures and corresponding response signals for access by the controller.

According to some embodiments, the virtual button structure may comprise: a button extending externally through an opening in the outer frame, and internally into contact with both of the first piezo-electric actuator and the second piezo-electric actuator; a projection extends outwardly from around the edge of the button with dimensions greater than the opening in the outer frame; and a gasket mounted between the projection and the outer frame.

According to some embodiments, the gasket may be comprised of a resilient material, and configured so that the gasket applies a force on the projection, thereby biasing the button into contact with the first piezo-electric actuator and the second piezo-electric actuator.

According to some embodiments the virtual button structure may comprise: a button formed in and integral with the outer frame, and extending internally into contact with both of the first piezo-electric actuator and the second piezo-electric actuator; and hinges comprised of thinned sections in the outer frame form a living hinge.

According to some embodiments, the virtual button structure may include a pin mounted at each end of the button proximate each hinge in a hole with a larger diameter than the pin, whereby a gap is formed between the pins and an inner wall of the outer frame, so that each pin contacts the inner wall of the frame after a desired deflection to provide a hard stop against the inner wall of the frame.

According to some embodiments, the first piezo-electric actuator and the second piezo-electric actuator may be mounted in a cavity in the outer frame; and the cavity may extend on either side of the hinges, thereby decreasing the stiffness of the outer frame at the hinges.

According to some embodiments, the virtual button structure may comprise: a button mounted over a cavity in the outer frame, and extending internally into contact with both of the first piezo-electric actuator and the second piezo-electric actuator; and a resilient elastic member providing a limited hinge at opposite ends of the button comprising sealing gaskets extending between the ends of the button and the outer frame.

A method of detecting a gesture in a system comprising a virtual button structure for mounting in an outer frame of a mobile device; and first and second piezo-electric actuators in contact with the virtual button structure configured to generate first and second varying electrical signals, respectively, in response to a dynamic force application to the virtual button structure.

The method comprises: i) determining magnitude and position of the force application on the virtual button structure over time, based on the first varying electrical signal and the second varying electrical signal; ii) determining a gesture corresponding to the magnitude and the position of the force application over time; and iii) providing a response signal based on the gesture.

BRIEF DESCRIPTION OF THE DRAWINGS

Some example embodiments will be described in greater detail with reference to the accompanying drawings, wherein:

FIGS. 4A-4D illustrate force vs time, position vs time, speed vs time and gesture vs time graphs, respectively, of the gesture detection system of FIG. 1;

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
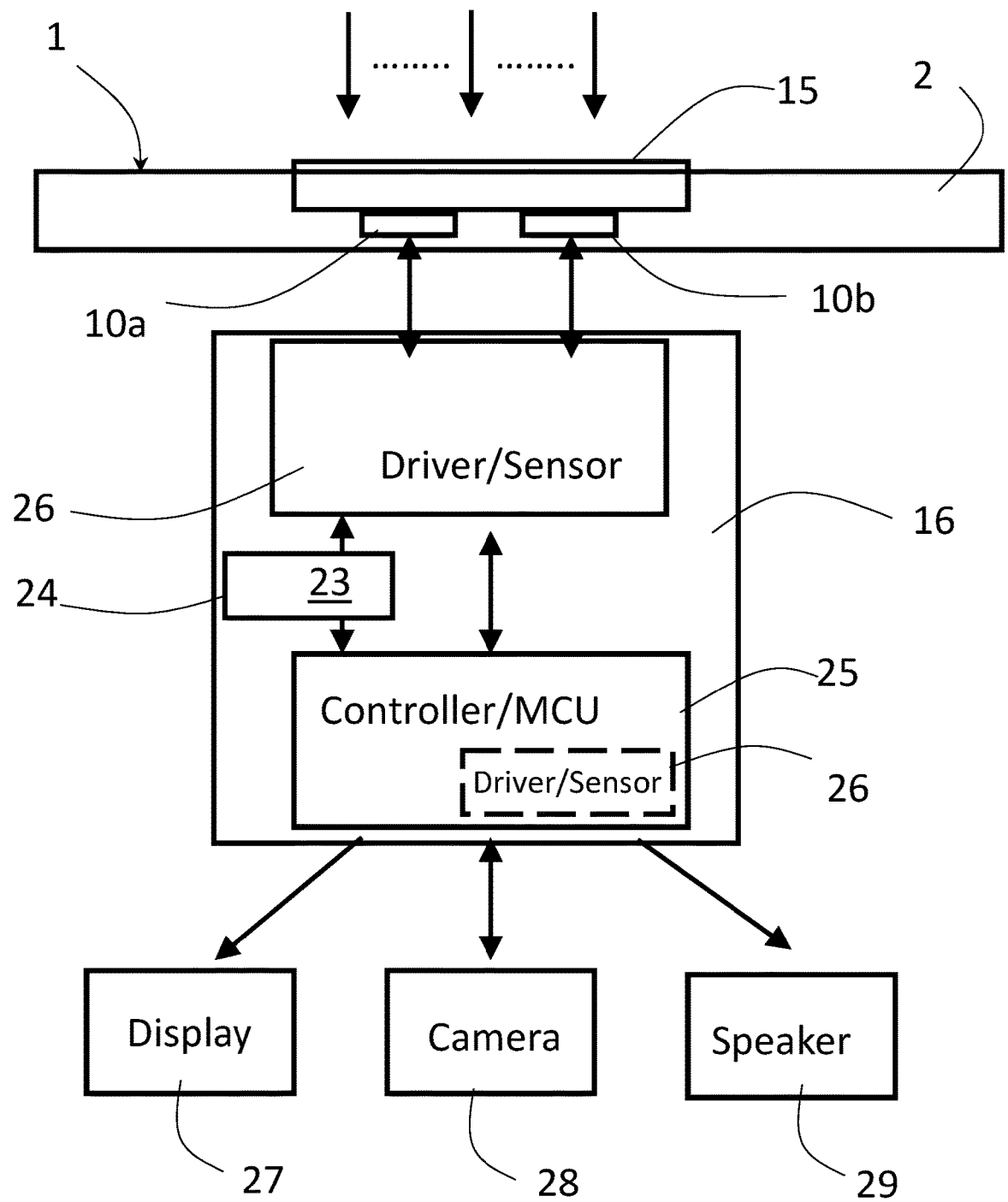
FIG. 1 is a schematic diagram of the gesture detection system of the present disclosure.

With reference to FIG. 1, a plurality of piezo-electric actuators, e.g. two or more piezo-electric actuators 10*a* and 10*b*, may be integrated in a housing, e.g. an outer frame 2, of a mobile device 1, such as a vehicle console, a smart phone or a tablet, which may include a virtual button structure 15, e.g. a virtual button structure disclosed in U.S. patent application Ser. No. 17/186,564, entitled Mechanical Integration of Buttons for Piezo-Electric Actuators, filed Feb. 26, 2021 in the name of the present applicant, which is incorporated herein by reference, that will couple different levels of force to each piezo-electric actuator 10*a* and 10*b* based on where the force is applied on the virtual button structure 15. A main controller processor 25, e.g. a microcontroller (MCU) integrated circuit chip or system on a chip (SOC) mounted on a PCB 16, provided within the mobile device 1, may be configured to generate and send control signals to other elements within the mobile device 1, such as a display 27, a camera 28 and a speaker 29. The main controller processor 25 may also be configured to drive and sense the plurality of piezo-electric actuators 10*a* and 10*b*; however, the drive and sense functionality may be integrated into a secondary controller processor 26, e.g. a separate piezo-electric actuator driver/sensor controller integrated circuit chip, provided separate from the main controller processor 25. Software and/or hardware algorithm instructions 20 executable by the main controller processor 25 and/or the secondary controller processor 26, which hereinafter may be referred to as "controller processor 26", may be stored on non-transitory memory 24 provided on the PCB 16 or elsewhere in the mobile device 1, that are able to infer the position and force applied by the user from the sensing data provided by the plurality of piezo-electric actuators 10*a* and 10*b*. The software and/or hardware algorithm instructions 20 may also be able to infer and differentiate between a number of different gestures based on a plurality of different gestures represented by different force and position data sets, and thereby actuate a different corresponding response, e.g. response signal, based on a corresponding gesture, i.e. force and data set. In response to the input signals from the plurality of piezo-electric actuators 10*a* and 10*b*, the driver/sensor controller processor 26 and/or the main controller processor 25 may generate and send control signals to the other elements within the mobile device 1, such as an activation signal to scroll the display 27, activate or focus the camera 28, or increase the volume on the speaker 29.

The virtual button structure 15 may be mounted in or on the outer frame 2, and include an outer surface facing outwardly configured to be contacted by the user, and an inner surface configured to be in contact with the plurality of piezo-electric actuators 10*a* and 10*b*, each of which generates varying electrical signals corresponding to a dynamic force application applied thereon, based on the piezoelectric effect. The dynamic force application may result from a gesture comprising a single stationary force application, e.g. a tap, applied at a single location at a specific position along the virtual button structure 15, e.g. over one of or in between the piezo-electric actuators 10*a* and 10*b*. The tap gesture may comprise a stationary force application with a magnitude above a minimum force threshold, which only lasts a short period of time, e.g. below a first time threshold level. The dynamic force application may result from a gesture comprising a stationary force application, e.g. a full button press, applied at a single location at a specific position along the virtual button structure 15, e.g. over one of or in between the piezo-electric actuators 10*a* and 10*b*. The full button press gesture may comprise a stationary force application with a magnitude that increases from the minimum force threshold to a maximum force threshold, which lasts a longer period of time, e.g. above the first time threshold level. The dynamic force application may result from a gesture comprising a moving force, e.g. swipe or a fling, applied at various locations along the virtual button structure 15 over time. The swipe may comprise a moving force application with a magnitude that increases from the minimum force threshold to a maximum force threshold, which lasts a longer period of time, e.g. above the first time threshold level. The swipe gesture may include a directional component, from one side of the virtual button structure 15 to the other, e.g. right to left and left to right, which corresponds to different gestures, and different resulting response signals by the main controller processor 25 and/or the driver/sensor controller processor 26. There may be other different swipe gestures, each with different resulting response signals, including swipe gestures which end at different locations, e.g. in between the first and second piezo-electric actuators 10*a* and 10*b*, and swipe gestures which begin or end with decreasing force and/or increasing force, e.g. a fling, scroll or drag, which may be slower or faster than a normal swipe and/or may end with less force and/or at a different location. A list, e.g. database, of different gestures and their corresponding force applications, i.e. force and position data sets, may be stored in the memory 24 along with the corresponding response signals for consultation by the main controller processor 25 and/or the driver/sensor controller processor 26.

The driver/sensor controller processor 26 receives the varying electrical signals and therefore senses the force application, e.g. the amount or magnitude of the force, the change in the magnitude of the force over time, and the difference in the magnitude of the force, perceived by each of the plurality of piezo-electric actuators 10*a* and 10*b* over a predetermined time period to generate a force data set. The software and/or hardware algorithm instructions 20 enables the driver/sensor controller 26 to process each force data set, and infer position of the force application, and the corresponding gesture that can be interpreted at the system level to create other actions in the system, i.e. the hand for instance scrolling the content on the display 27. Some gestures may also feature a haptic response. In which case the driver/sensor controller processor 26, sends a driving signal to one or both of the piezo-electric actuators 10*a* and 10*b* to create a haptic effect, which the user will sense via the virtual button structure 15.

Figure 2:
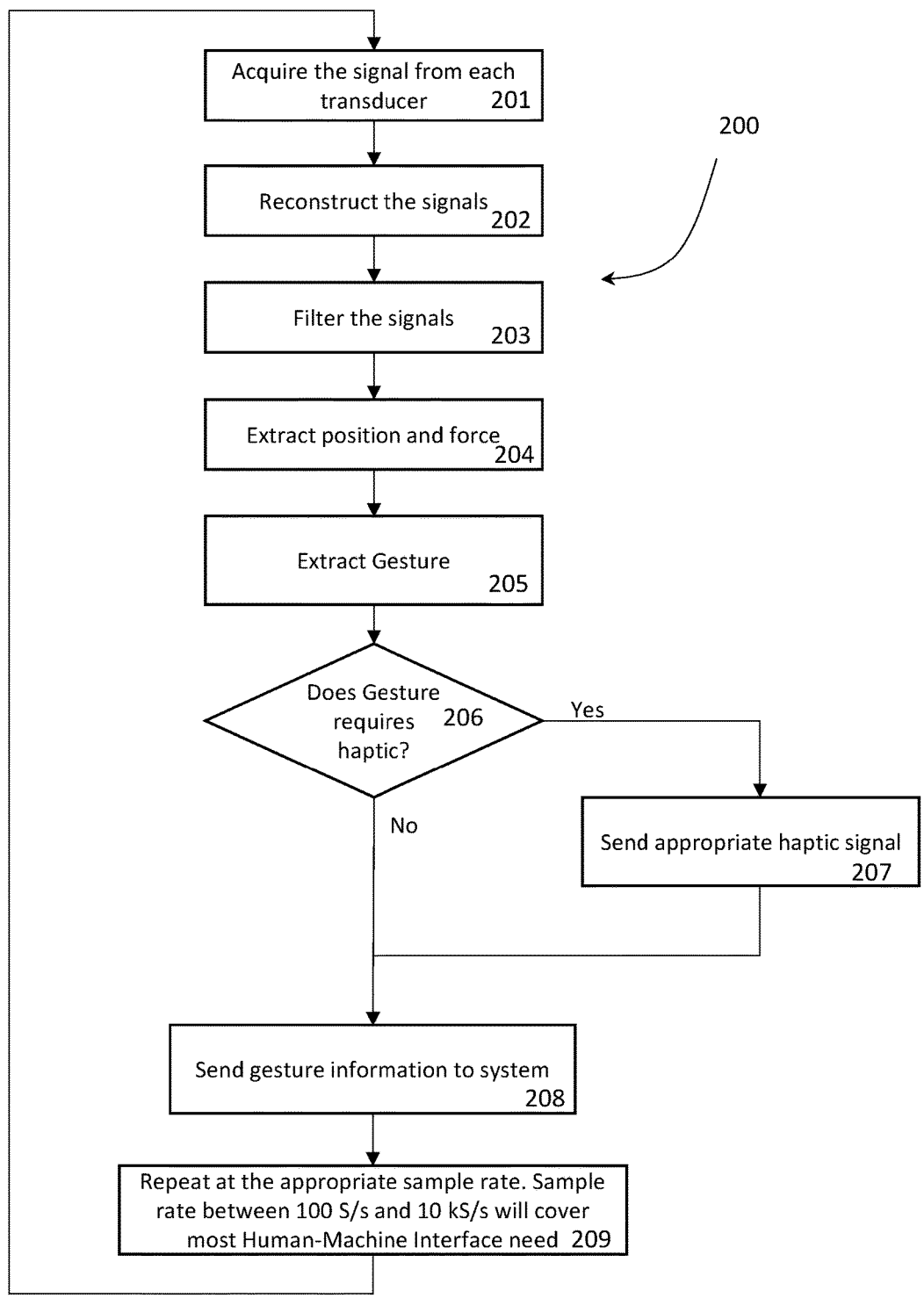
FIG. 2 is a flow chart of a general algorithm of the gesture detection system of FIG. 1.

FIG. 2 presents an exemplary set of the software and/or hardware algorithm instructions 20 used to extract gestures from the electrical signals of the plurality of piezo-electric actuators 10*a* and 10*b*. The software and/or hardware algorithm instructions 20 start by acquiring (201) the varying electrical signals from the plurality of actuators 10*a* and 10*b* at substantially the same time so that both electrical signals represent the magnitude of the force applied on the surface of the virtual button structure 15 and/or the piezo-electric actuator 10*a* and 10*b*, at a specific time. In some practical implementations, the electrical signals may need to be reconstructed (202) with an algorithm similar to the one proposed in U.S. Pat. No. 11,024,793 entitled High Resolution Sensing of Piezo-Electric Transducers, issued Jun. 1, 2021, in the name of the present applicant, which is incorporated herein by reference.

To remove high frequency noise, some or all of the electrical signals may then be filtered (203) with a digital low-pass filter. The cut-off frequency may be chosen according to the fastest signals that the system needs to detect. For most HMI (Human Machine Interface) applications, the cut-off frequency may be chosen between 5 Hz and 50 Hz. From the filtered electrical signals another set of algorithm instructions 300, described in FIG. 3, may be used to extract the force and position data set of the applied force (204).

From the force and position data set, the gesture algorithm 300 extracts a gesture (205), e.g. from one or more of the magnitude of the force application, the position of the force application and a change in position of the force application. The gesture may be for example a full button press with information on the position derived from relative magnitudes at one time from the plurality of piezo-electric actuators 10*a* and 10*b*, e.g. in between two or over one of the plurality of piezo-electric actuators 10*a* or 10*b*, and with a force magnitude, e.g. above a predetermined threshold. The gesture may be a swipe, scroll, drag or a fling in either direction, with information derived from a change in position and/or relative magnitudes of the force application over time with a force magnitude, e.g. above a predetermined threshold and/or decreasing in magnitude. The gesture may be a tap with information on the position derived from the relative magnitudes at one time from the plurality of piezo-electric actuators 10*a* and 10*b*, e.g. a force magnitude above a predetermined threshold for a time period below a predetermined limit.

When the software and/or hardware algorithm instructions 20 determines (206) that the gestures requires a haptic feedback, an appropriate haptic electrical signal may be sent (207) from the driver/sensor controller processor 26 to one or more of the plurality of piezo-electric actuators 10*a* and 10*b*. The information on the gesture may be sent (208) to the system controller processor 25 to trigger different behavior, such as scrolling the display 27, selecting in a menu, etc. or to the driver/sensor controller processor 26 to generate a haptic response in one or more of the plurality of piezo-electric actuators 10*a* and 10*b*. The software algorithm instructions 20 may be repeated (209) at a rate of between 100 Samples/second to 10 kilo-samples/second depending on the system requirements in terms of detection latency and gesture duration.

Figure 3:
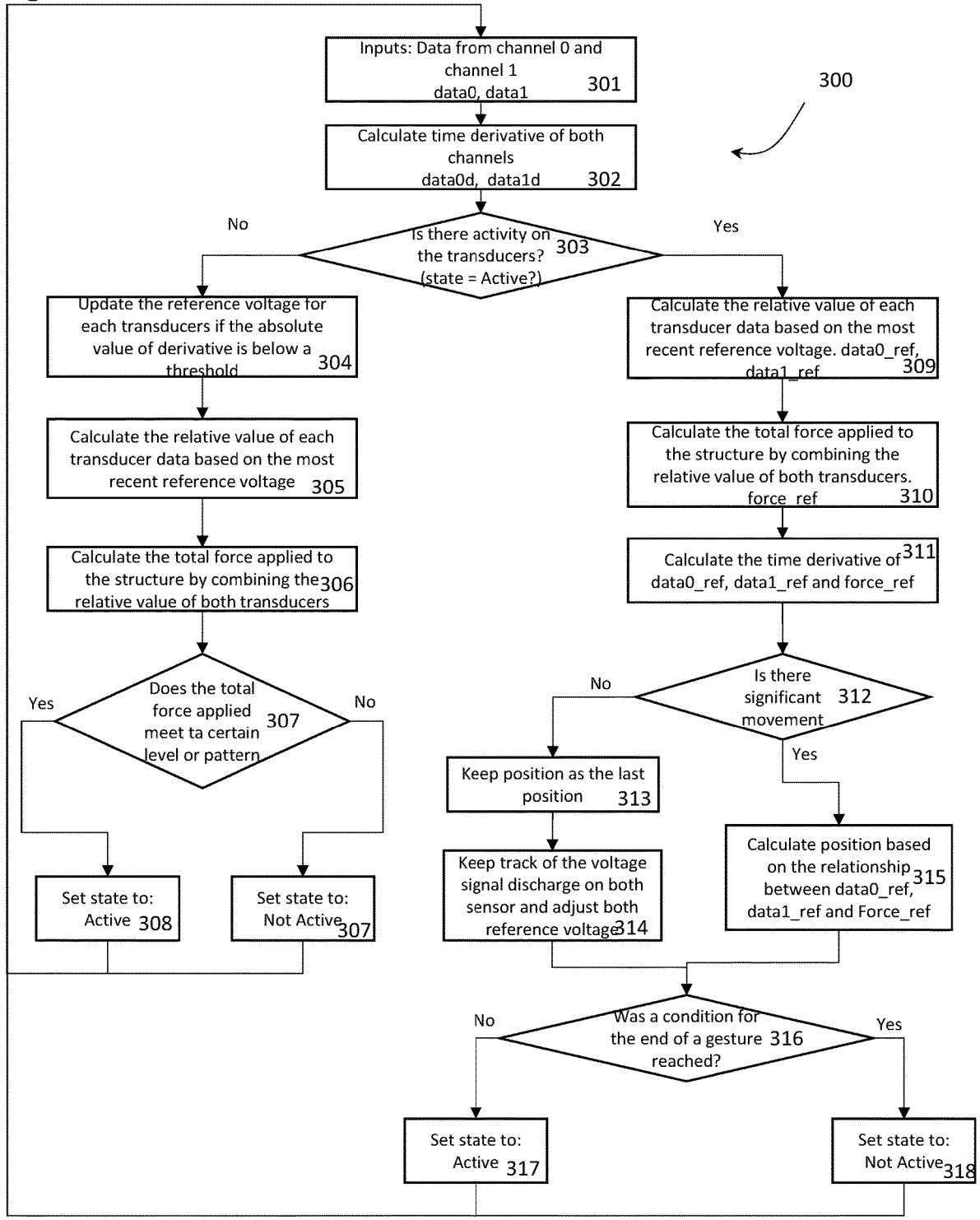
FIG. 3 is a flow chart of a position and force extraction algorithm of the gesture detection system of FIG. 1.
Figure 5:
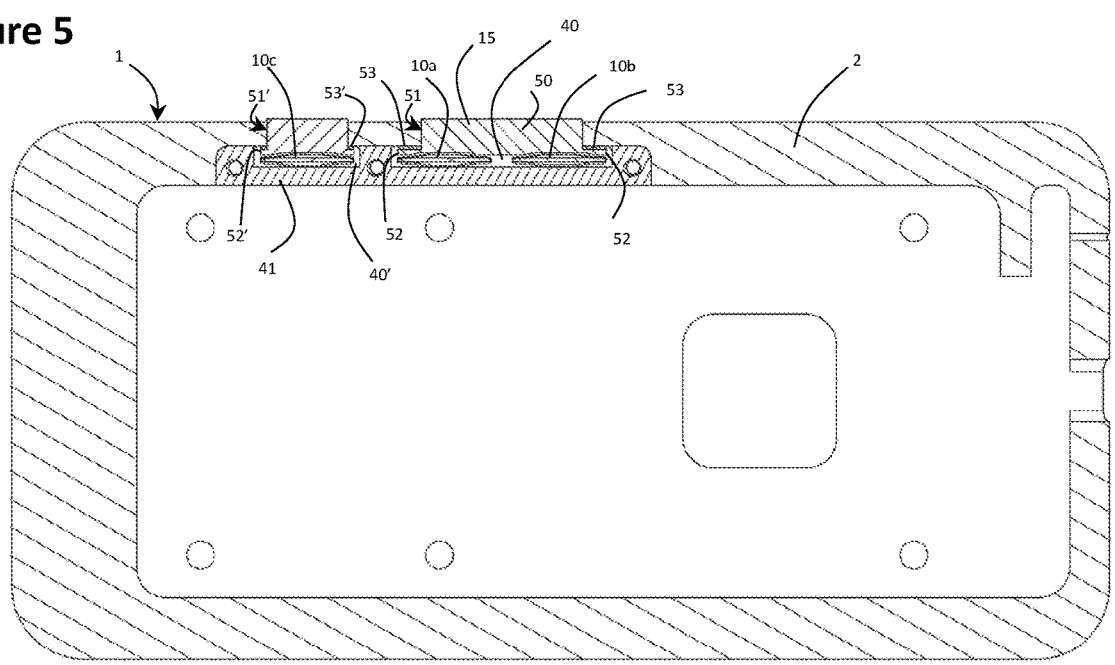
FIG. 5 is a cross-sectional view of a first exemplary virtual button structure of the gesture detection system of FIG. 1.
Figure 6:
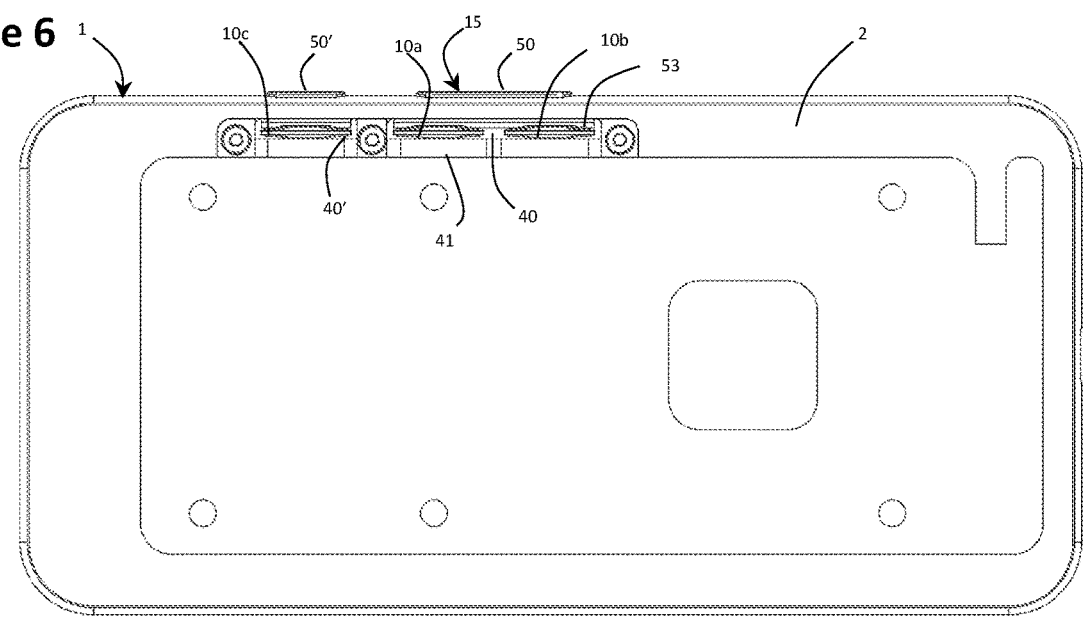
FIG. 6 is a side view of the first exemplary virtual button structure of the gesture detection system of FIG. 1.
Figure 7:
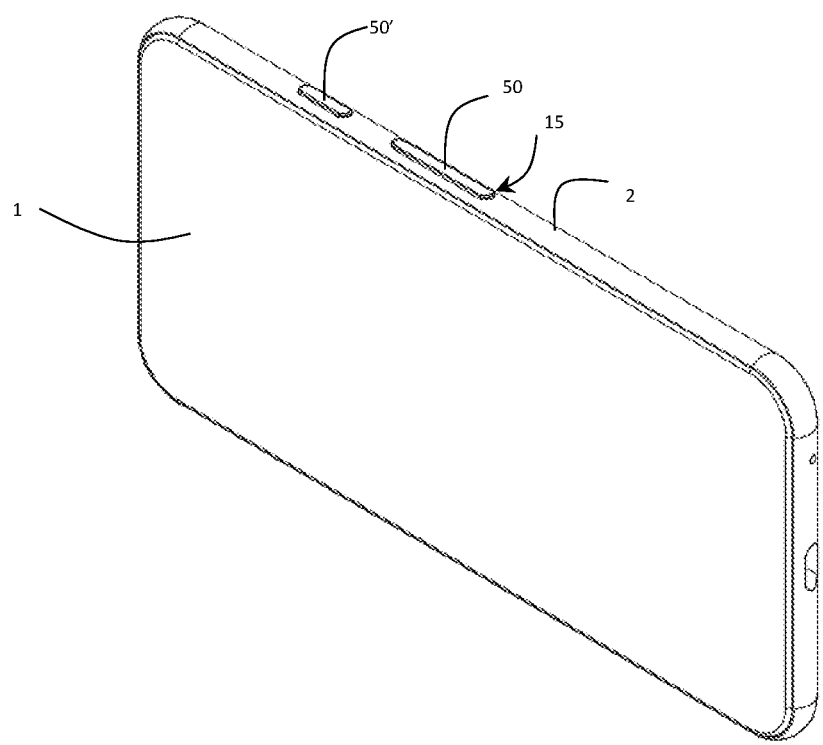
FIG. 7 is a rear isometric view of the first exemplary virtual button structure of the gesture detection system of FIG. 1.
Figure 8:
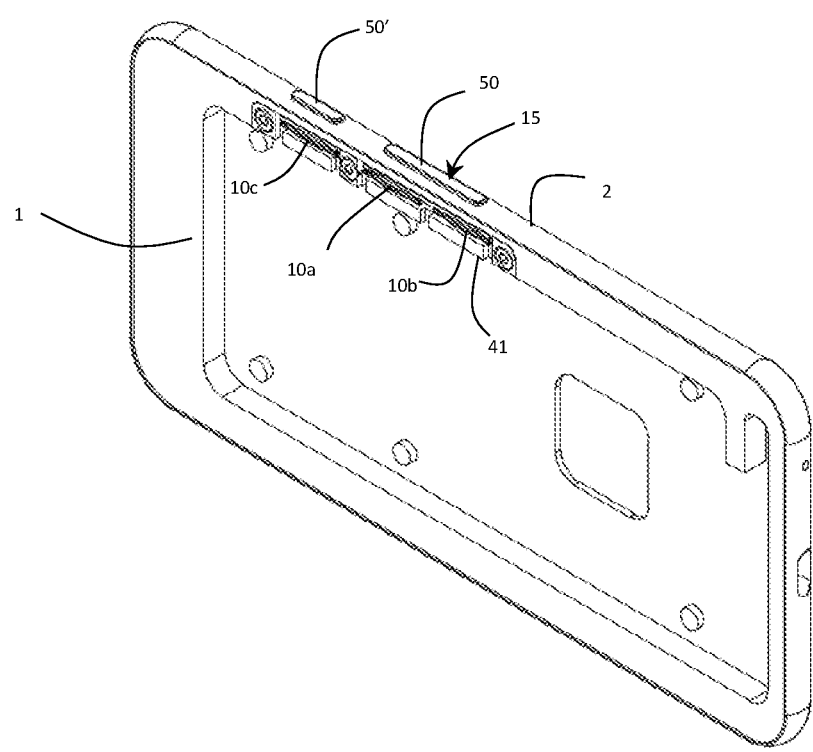
FIG. 8 is a front isometric view of the first exemplary virtual button structure of the gesture detection system of FIG. 1.

FIG. 3 presents the gesture algorithm 300 executed by the driver/sensor controller processor 26 to extract the force and position data set, as in step 204 above, from the reconstructed electrical signals from the plurality of piezo-electric actuators 10a and 10b. The following example describes an example including a first piezo-electrical actuator 10a and a second piezo-electrical actuator 10b, but additional piezo-electric actuators are within the scope of the invention. The force and position data from both channels 0 and 1, i.e. the first and second piezo-electric actuators 10a and 10b, are received (301) from the reconstruction stage 202 or the filtering stage 203. The time derivative of the force data set may be calculated by calculating the difference between the previous data, e.g. electrical voltage signals from the first and/or the second piezo-electric actuators 10a and 10b, and the current data, e.g. electrical voltage signals from the first and/or the second piezo-electric actuators 10a and 10b, for both channels 0 and 1, and dividing the result by the time interval between the two data sets (previous and current) to generate a change in the magnitude of the force on the first piezo-electric actuator 10a and a change in the magnitude of the force on the second piezo-electric actuator 10b over time. Since a piezo-electric actuator may not be good at detecting slow changes in force magnitude, the derivative will enable the gesture algorithm 300 to circumvent some of the shortcomings of the first and second piezo-electric actuators 10a and 10b. The gesture algorithm 300 determines (303) which state the system is in, between two states, e.g. a not active or rest state and an active state.

In the initial state, no activity is detected. While no activity is detected, the gesture algorithm 300 may update (304) the reference voltage for each of the first and second piezo-electric actuators 10a and 10b, since they may vary due to external factors. The gesture algorithm 300 may only update the reference voltage values when the absolute value of the derivative is below a certain reference voltage threshold. The value of the reference voltage threshold will vary greatly based on the mechanical integration of the system and the sensitivity of the first and second piezo-electric actuators 10a and 10b. In the exemplary embodiment, the reference voltage threshold is set to about 300 mV/s. Then, the relative value of each piezo-electric actuator 10a and 10b is computed (305) based the most recent reference voltage for each channel 0 and 1. The relative values represent the magnitudes of the portions of the force applied on each of the first and second piezo-electric actuators 10a and 10b. The next step (306) is to combine the magnitudes of the portions of the force from the two channels 0 and 1 to obtain the total magnitude of the force applied on the outer surface of the virtual button structure 15. In the simplest implementation the two magnitudes of the portions of the force may be added with simple addition. However, in some systems, it is possible that another relationship exists between the first and second piezo-electric actuators 10a and 10b that needs to be taken into account. For instance the first and second piezo-electric actuators 10a and 10b may not have the same sensitivity or the mechanical integration may not distribute the force on the first and second piezo-electric actuators 10a and 10b equally.

When the gesture algorithm 300 detects (307) that the total magnitude of the force application is less than a predetermined lower threshold level or if the force application does not meet a certain pattern, e.g. based on its derivative, the state of the gesture algorithm 300 may remain (308) at rest or the Not Active state. When the gesture algorithm 300 detects (308) that the magnitude of the total force is greater than the predetermined lower threshold level or if the force application meets a certain pattern, for instance based on its derivative, the state of the gesture algorithm 300 may be changed (308) to Active. When in the Active state, the first step (309) is to calculate the magnitude of each of the portions of the force from the piezo-electric actuators, e.g. first and second piezo-electric actuators 10a and 10b, and then calculate the magnitude of the total force (310). Once these variables are calculated, the gesture algorithm 300 may calculate (311) the time derivative, e.g. change over time of: 1) the force on the first piezo-electric actuator 10a (data0_ref), 2) the force on the second piezo-electric actuator 10b (data1_ref), and 3) the total force on both the first and second piezo-electric actuators 10a and 10b, i.e. on the virtual button structure 15, (force_ref). The calculation may operate at the sampling rate of the system, and is typically performed on two points, the current point and the previous point. From the derivatives and/or the absolute values, the gesture algorithm 300 may determine when there is significant movement (312) of the user's finger on the virtual button structure 15, i.e. across the piezo-electric actuators 10a and 10b. Step 312 may be useful for ensuring good behavior of the gesture detection system. When a user holds substantially the same force for a long time on one of the piezo-electric actuators 10a or 10b, the resulting voltage signal tends to decrease even if the force applied on the piezo-electric actuator 10a or 10b does not change. This decision point enables the processing of the data differently when no significant movement occurs. When no significant movement is detected (313), the position is kept as the last position recorded. The driver/sensor controller 26 may keep track of the natural voltage discharge (314) occurring on the piezo-electric actuators 10a and 10b. While no significant movement occurs, the total voltage discharge is calculated and the reference voltage is adjusted to cancel the effect of this discharge on the force data set. As long as there is not significant movement, the reference voltage that was initially set in step 304 is adjusted in 314 to cancel the effect of the discharge. For instance, if the initial reference voltage was 0 V, and in 314 a voltage discharge of 100 mV is detected, than the reference voltage for that channel would be set to −100 mV.

When there is enough movement detected (315) on the piezo-electric actuators 10a and 10b, the position is based on the relationship between the force measurements, i.e. the corresponding voltage measurements: data0_ref, data1_ref and force_ref. In the simplest implementation, the ratio between the magnitude of the force on the first piezo-electric actuator 10a (data0_ref) and the magnitude of the total force (force_ref) may provide the position in percent along the outer surface of the virtual button structure 15 over top of the piezo-electric actuators 10a and 10b. For example, when the voltage measurements data0_ref, data1_ref are substantially equal, i.e. about 50% of the total force is measured in each of the first and second piezo-electric actuators 10a and 10b, then the position of the force application may be determined by the driver/sensor controller 26 to be directly in between the first and second piezo-electric actuators 10a and 10b. However, when one of the voltage measurements data0_ref, data1_ref is at least 2 times the other, i.e. about 65%-80% of the total force is measured in one of the first or second piezo-electric actuators 10a and 10b and a ratio therebetween substantially constant, then the position of the force application may be determined by the driver/sensor controller 26 to be directly over the first or the second piezo-electric actuators 10a and 10b, respectively. After the position is determined, the gesture detection step 205 is run and provides feedback to the gesture algorithm 300 to decide (316) if the end of a gesture segment was reached. When the end of the gesture segment has not been reached, the gesture algorithm 300 remains active (317). When the end of a gesture segment is reached, the state is switched back to Not Active (318).

The extract gesture step 205 uses information on the position vs time and/or force vs time data to identify different gestures. For instance, a full button press may be detected by a force higher than the lower threshold level combined with a position that is quasi-static. While a swipe, scroll, drag or a fling may be detected when the position changed by a certain percentage, e.g. greater than 10%, preferably greater than 25%, of distance along the upper surface of the virtual button structure 15 since the beginning of the activity. The end of a gesture may be detected when the user releases force from the surface of the virtual button structure 15. The end position and/or the end force and/or the speed of the gesture may differentiate between a swipe a fling, a scroll or a drag, e.g. a fling may end between the first and second piezo-electric actuators 10a and 10b and/or may end with a force below a swipe threshold level and/or have a speed greater than a swipe threshold level.

FIGS. 4A to 4D illustrate exemplary results from the system. In FIG. 4A, a swipe gesture is illustrated in a Force vs Time graph. The graph shows the evolution of a dynamic force application (total force) applied during a gesture from a minimum force threshold, e.g. 0.1 N, increasing at a substantially constant rate to a maximum force, e.g. 1.5 N, in a first time period, e.g. 0.3 to 0.4 seconds, then maintaining a substantially constant value, e.g. 1.5 N, for a second time period, e.g. 0.3 to 0.4 seconds. The dynamic force application may be converted by the driver/sensor controller 26 from Volts to Newtons using detailed conversion factors based on the mechanical integration of the piezo-electric actuators 10a and 10b, such as the structure stiffness and transducer sensitivity. A fling gesture may look similar, but may increase faster, have a lower maximum force, and decrease faster. Similarly, a tap gesture would increase faster and decrease faster. A full button press may look the same for the first half of time, but decrease in the second the second half of the time.

The plot in FIG. 4B provides the position of the dynamic force application in mm along the virtual button structure 15. For example, an initial increasing force is applied at the same position, e.g. 15 mm along the virtual button structure 15, for the first time period. Then the dynamic force application moves along the virtual button structure 15, while maintaining the constant force for the second time period, thereby moving from a first position 15 mm from a reference point to second position 4 mm from the reference point. The position may be converted from percentage of force applied on one or both piezo-electric actuators 10a and 10b, to mm using detailed conversion factors based on the mechanical integration of the piezo-electric actuators 10a and 10b, such as the distance between to the two piezo-electric actuators 10a and 10b. A plot of a fling gesture may look similar, but may change position sooner, and not have as large a change in position. A plot of a full button press and a tap gestures would have a constant position and over a shorter period of time The speed graph 4C provides the speed in mm/ms of the finger along the upper surface of the virtual button structure 15 over time in seconds. For example, the speed remains somewhat constant, e.g. 0 mm/ms, during the initial application of force during the first time period, and increases at substantially a constant rate to a maximum speed at the end of the second time period, after which the speed returns to zero as the user's finger is released from the virtual button structure 15. A plot of a fling gesture may look similar, but may have higher speeds over shorter period of time. A plot of a tap gesture or a full button press may appear as a substantially straight line Finally, the last graph 4D provides different information on the gesture, such as the type, e.g. tap, full press, fling or swipe, the average speed, e.g. above a limit (such as −0.01 mm/ms) indicative of a swipe, and the distance of the gesture, e.g. larger than a limit (such as 5 mm) indicative of a swipe. It also shows the release signal that is used to end the detection of a gesture. In FIG. 4D, when Gesture equals 0, no gesture is detected. When Gesture equals 1 a swipe gesture is detected. When Release=1, it means the gesture ended. A fling gesture may equal 2, while a tap gesture equals 3, and a full button press equals 4, but any combination is possible.

A first exemplary embodiment of a virtual button structure 15 is illustrated in FIGS. 5 to 8. The first piezo-electric actuator 10a and the second piezo-electric actuator 10b may be mounted side by side on or within the outer frame 2 of the mobile device 1. The first and second piezo-electric actuators 10a and 10b may be mounted within a cavity 40 in the outer frame 2, i.e. against an inner wall of the outer frame 2, or against a base 41 fixed to the outer frame 2, as in FIGS. 5-8. Additional individual or paired piezo-electric actuators, e.g. individual piezo-electric actuator 10c, may be provided independent of the first and second piezo-electric actuators 10a and 10b to provide additional independent or shared control features.

The virtual button structure 15 may comprise a single button 50 including an external surface extending externally through an opening 51 in the outer frame 2, and an internal surface extending internally into contact with both of the first piezo-electric actuator 10a and the second piezo-electric actuator 10b. A projection 52 extends outwardly from around the edge of the button 50 with dimensions greater than the opening 51 in the outer frame 2 preventing the button 50 from falling out. A gasket 53 may be mounted between the projection 52 and the outer frame 2. The gasket 53 may be configured to provide multiple features, such as sealing the outer frame 2 from the ingress of dirt and/or water. Additionally, the gasket 53 may be comprised of a resilient material, e.g. foam, and pre-compressed, so that the gasket 53 applies a force on the projection 52, thereby biasing the button 50 into contact with the first piezo-electric actuator 10a and the second piezo-electric actuator 10b.

Accordingly, a force applied at one end of the button 59 over top of the first piezo-electric actuator 10a will generate a larger voltage signal, e.g. greater than 2×, preferably 2×-4× greater, in the first piezo-electric actuator 10a and a relatively smaller voltage signal in the second piezo-electric actuator 10b, and vice versa. Whereas, a force applied to the middle of the button 50 will generate substantially equal voltage signals in both the first piezo-electric actuator 10a and the second piezo-electric actuator 10b. Therefore, a swiping motion or a fling motion from one end of the button 50 to the other end may generate voltage signals in the first and second piezo-electric actuators 10a and 10b that rise and fall at different times and at different rates, as hereinbefore discussed.

The third piezo-electric actuator 10c may be mounted within the same cavity 40 or a secondary cavity 40' in the outer frame 2. The third piezo-electric actuator 10c may be activated by the button 50 or a secondary button 50' configured to fit into the opening 51 or a secondary opening 51'. A secondary projection 52' may extend outwardly from around the edge of the secondary button 50' with dimensions greater than the secondary opening 51' in the outer frame 2 preventing the secondary button 50' from falling out. A secondary gasket 53' may be mounted between the secondary projection 52' and the outer frame 2, as hereinbefore described.

Figure 9:
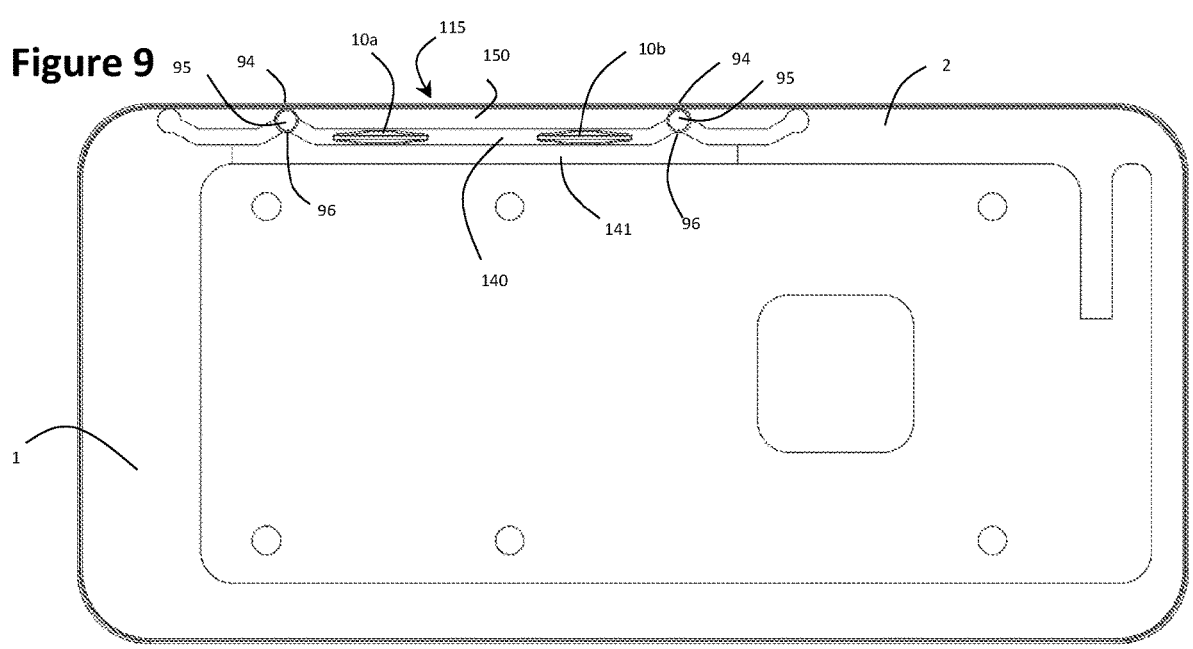
FIG. 9 is a side view of the second exemplary virtual button structure of the gesture detection system of FIG. 1.
Figure 10:
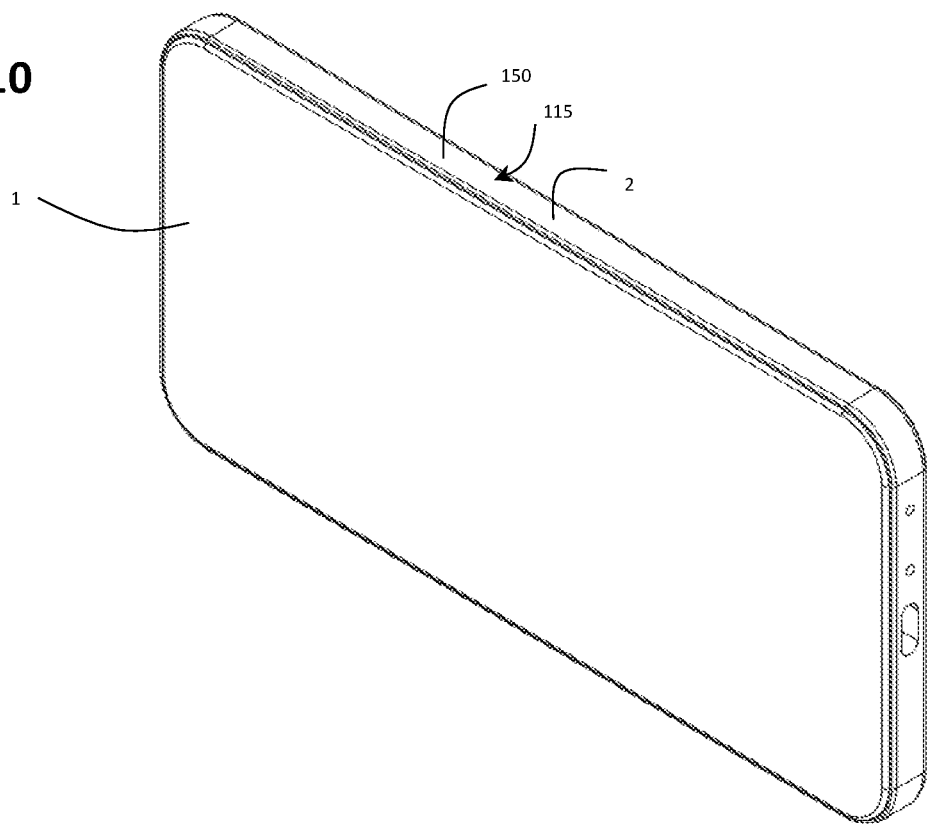
FIG. 10 is a rear isometric view of the second exemplary virtual button structure of the gesture detection system of FIG. 1.
Figure 11:
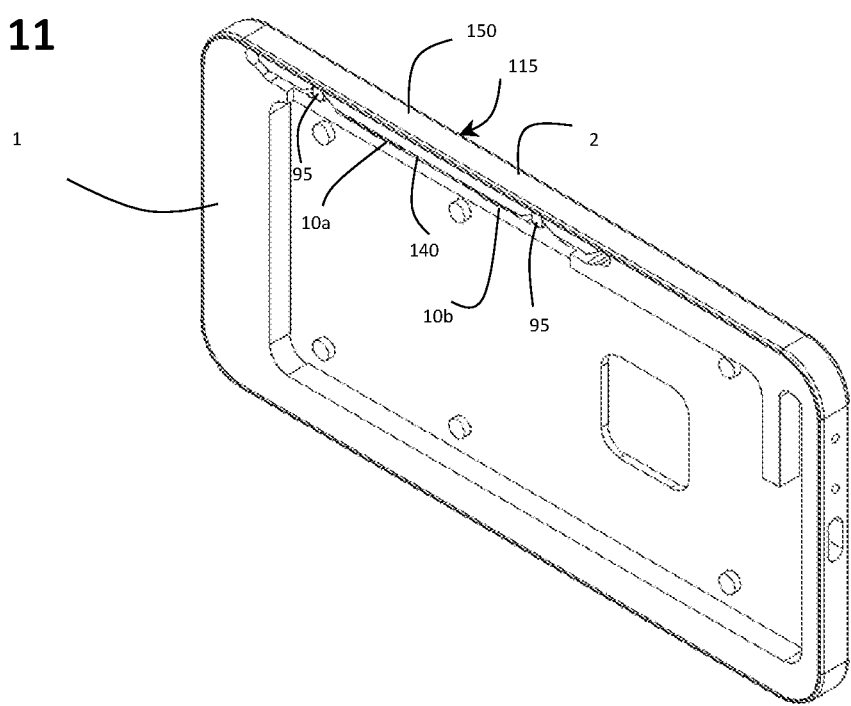
FIG. 11 is a front isometric view of the second exemplary virtual button structure of the gesture detection system of FIG. 1.

A second exemplary embodiment of a virtual button structure 115 is illustrated in FIGS. 9 to 11. The first piezo-electric actuator 10*a* and the second piezo-electric actuator 10*b* may be mounted side by side within an outer frame 2 of the mobile device 1. The first and second piezo-electric actuators 10*a* and 10*b* may be mounted within a cavity 140 in the outer frame 2, i.e. against an inner wall of the outer frame 2, or against a base 141 fixed to the outer frame 2.

The virtual button structure 115 may comprise a single button 151 formed in and integral with the outer frame 2, without requiring any sealing gaskets between the buttons 151 and the frame 2, and extending internally into contact with both of the first piezo-electric actuator 10*a* and the second piezo-electric actuator 10*b*. Hinges 94, i.e. thinned sections in the outer frame 2, may form a living hinge, providing limited local deformation, e.g. approximately 0.02 mm-0.5 mm for 5 N force and a sidewall rigidity of 10 N/mm to 250 N/mm, but preferably 0.07 mm to 0.5 mm deflection for 10 N/mm to 70 N/mm rigidity. The thickness of the outer frame 2 thins from a normal thickness, e.g. of 3 mm-6 mm, to a reduced thickness at the edges of the virtual button structure 115, e.g. to 10% to 50% of the original thickness or to 0.5 mm to 2 mm, preferably 1 mm to 2 mm.

A pin 95, e.g. cylindrical, may be mounted at one or each end of the button 150, proximate each hinge 94 in a hole 96 formed at each end of the cavity 140 with a slightly larger diameter than the pin 95, whereby a gap is formed between the pins 95 and the inner wall of the holes 96, i.e. the frame 2. Accordingly, the pins 95 contact the inner wall of the holes 96, i.e. the frame 2, after a desired deflection, i.e. equal to the gap, and provide a hard stop against the inner wall of the frame 2, thereby preventing too large a force from being applied to the first piezo-electric actuator 10*a* and/or the second piezo-electric actuator 10*b*, and too much deflection, which would result in damage thereto. To add extra flexibility to the virtual button structure 115, the cavity 140 may be extended on either side of the pins 95, thereby decreasing the stiffness of the frame 2 at the hinges 94.

Figure 12:
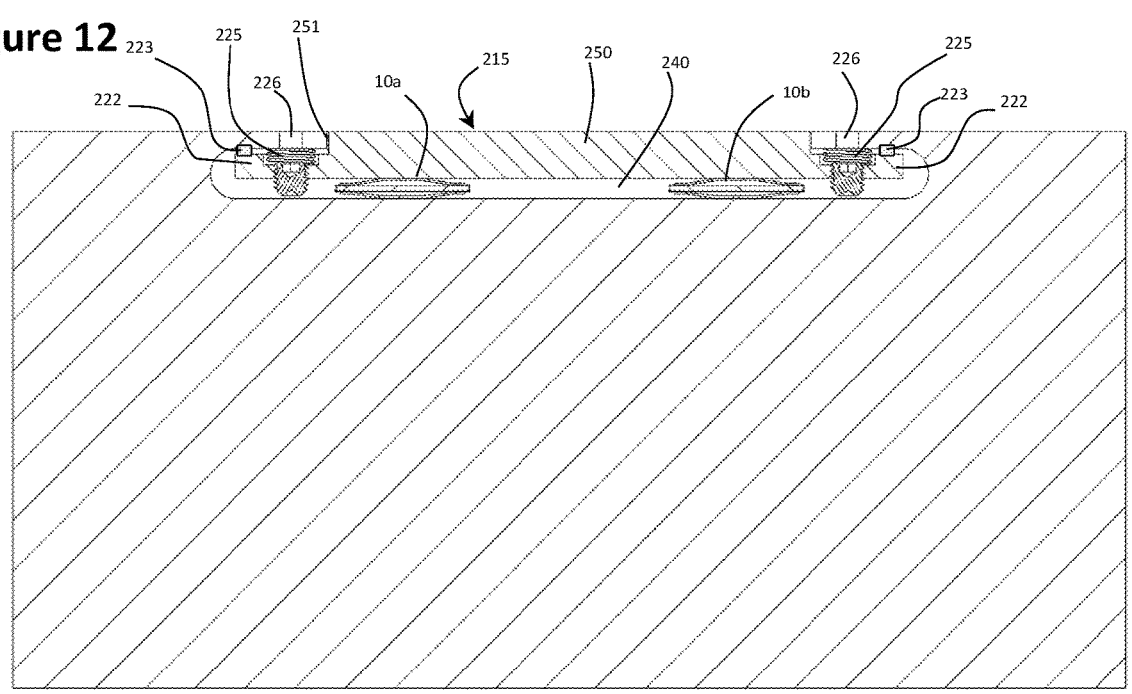
FIG. 12 is a cross-sectional view of a third exemplary virtual button structure of the gesture detection system of FIG. 1.
Figure 13:
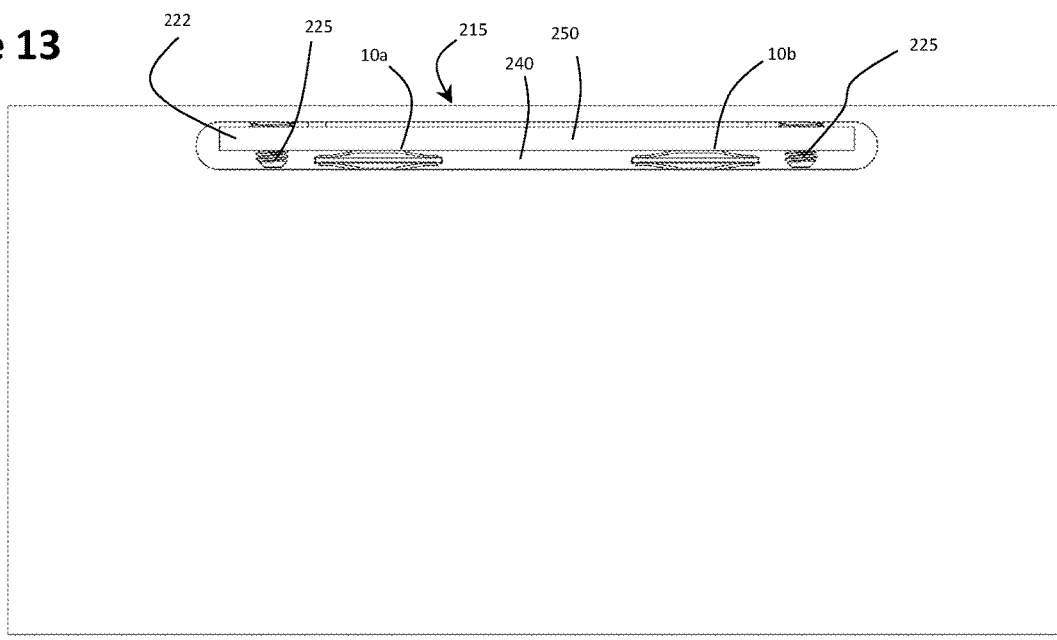
FIG. 13 is a side view of the third exemplary virtual button structure of the gesture detection system of FIG. 1.
Figure 14:
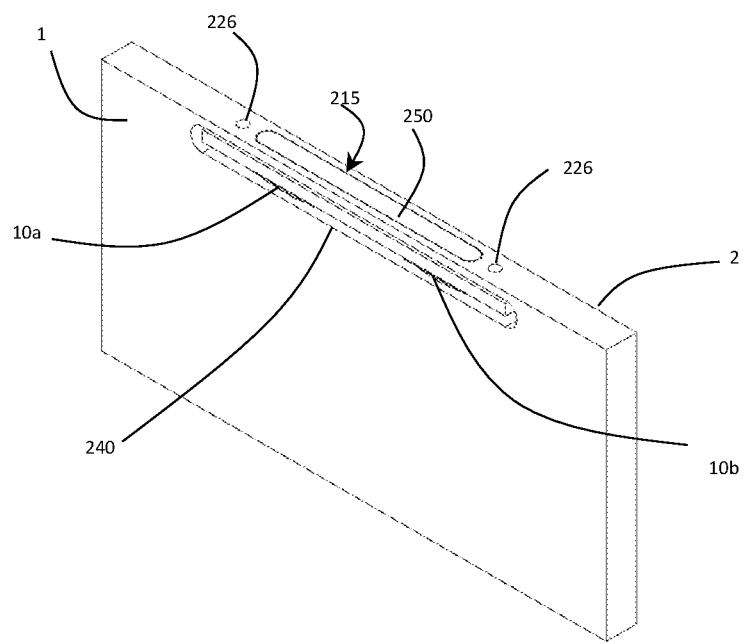
FIG. 14 is a front isometric view of the third exemplary virtual button structure of the gesture detection system of FIG. 1.
Figure 15:
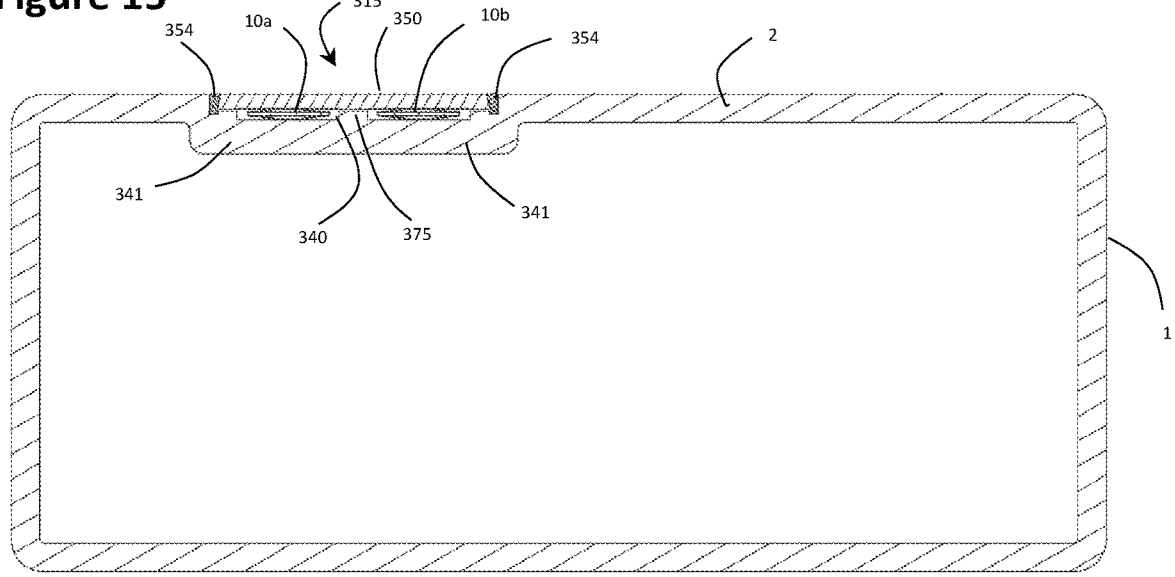
FIG. 15 is a cross-sectional view of a fourth exemplary virtual button structure of the gesture detection system of FIG. 1.
Figure 16:
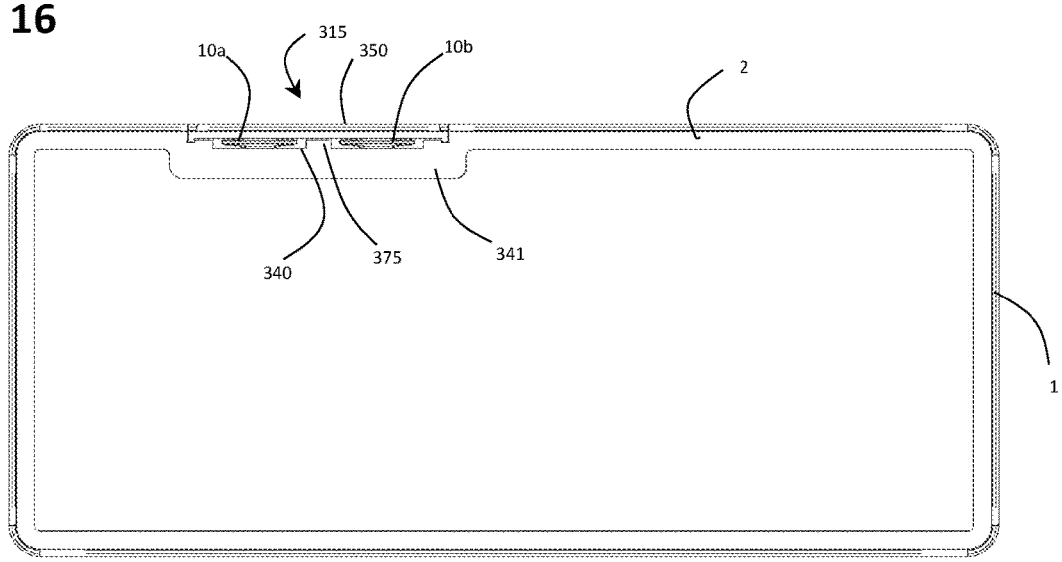
FIG. 16 is a side view of the fourth exemplary virtual button structure of the gesture detection system of FIG. 1.
Figure 17:
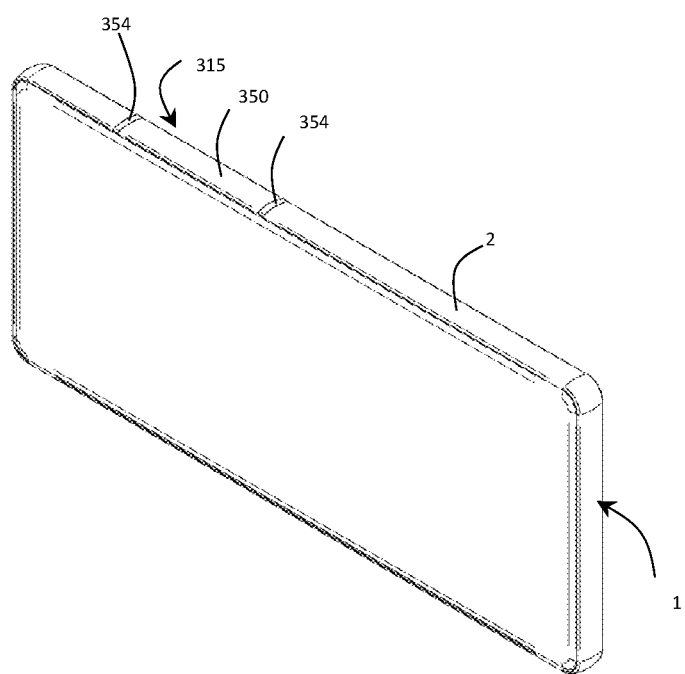
FIG. 17 is a rear isometric view of the fourth exemplary virtual button structure of the gesture detection system of FIG. 1.
Figure 18:
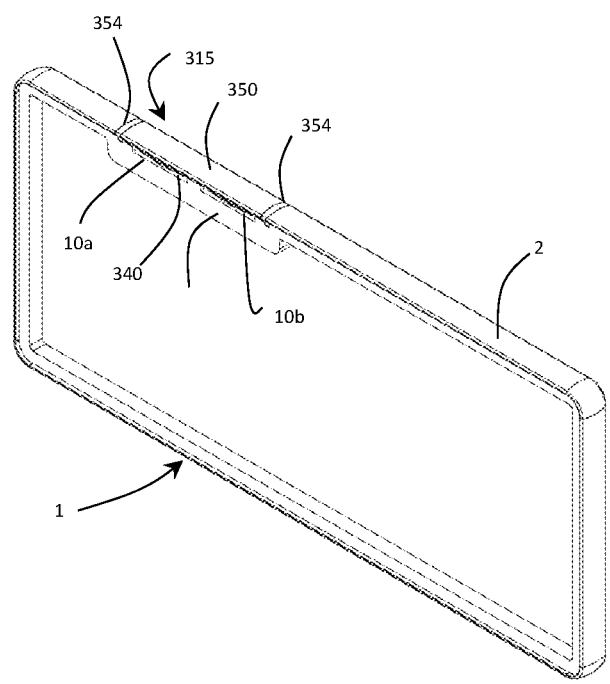
FIG. 18 is a front isometric view of the fourth exemplary virtual button structure of the gesture detection system of FIG. 1.

A third exemplary embodiment of a virtual button structure 215 is illustrated in FIGS. 12 to 14. The first piezo-electric actuator 10*a* and the second piezo-electric actuator 10*b* may be mounted side by side within an outer frame 2 of the mobile device 1. The first and second piezo-electric actuators 10*a* and 10*b* may be mounted within a cavity 240 in the outer frame 2, i.e. against an inner wall of the outer frame 2, or against a base fixed to the outer frame 2, as in FIGS. 5-8. Additional individual or paired piezo-electric actuators, e.g. individual piezo-electric actuator 10*c*, may be provided for independent or joint control features with the first and second piezo-electric actuators 10*a* and 10*b*.

The virtual button structure 215 may comprise a single button 250 with an outer face extending externally through an opening 251 in the outer frame 2, and internally into contact with at least both of the first piezo-electric actuator 10*a* and the second piezo-electric actuator 10*b* and any additional piezo-electric actuators. A projection 222 extends outwardly from around the edge of the button 250 with dimensions greater than the opening 251 in the outer frame 2 preventing the button 250 from falling out. A gasket 223 may be mounted between the projection 222 and the outer frame 2. The gasket 223 may be configured to provide multiple features, such as sealing the outer frame 2 from the ingress of dirt. Set screws 225 may be provided extending through the projection 222 into contact with the inner wall of the outer frame 2. Holes 226 extending through the outer frame 2 above the set screws 225 may be provided to enable access to the set screws 225 for adjustment thereof.

A fourth exemplary embodiment of a virtual button structure 315 is illustrated in FIGS. 15 to 18. The first piezo-electric actuator 10*a* and the second piezo-electric actuator 10*b* may be mounted side by side within the outer frame 2 of the mobile device 1. The first and second piezo-electric actuators 10*a* and 10*b* may be mounted within a cavity 340 in the outer frame 2, i.e. against an inner wall structure 341 integral with the outer frame 2, or against a base fixed to the outer frame 2, as in FIGS. 5-8.

The virtual button structure 315 may comprise a single button 350 mounted over the cavity 340 parallel and/or coplanar with the outer frame 2, and extending internally into contact with both of the first piezo-electric actuator 10*a* and the second piezo-electric actuator 10*b*. A resilient elastic member provides a limited hinge 354, which may be formed of sealing gaskets extending between the edges of the button 350 and the outer frame 2. The hinges 354, i.e. gaskets, may be configured to provide multiple features, such as sealing the outer frame 2 from the ingress of dirt and/or water, and provide a hinge for the button 350.

In any of the aforementioned examples, a pedestal 375 may extend from the base 41 or 141, or from the inner wall structure 341 into the cavity 40, 140, 240 or 340 between the first and second piezo-electric actuators 10*a* and 10*b* forming a gap with the button 50, 150, 250 or 350. The gap is large enough to enable the button 50, 150, 250 or 350 to be depressed far enough to activate the first and/or second piezo-electric actuators 10*a* and 10*b*; however, if an attempt is made to depress the button 50, 150, 250 or 350 too far, e.g. to a point that will damage the first and/or second piezo-electric actuators 10*a* and 10*b*, the pedestal 375 forms a hard stop for the button 50, 150, 250 or 350, preventing the button from being further depressed, thereby preventing the first and/or second piezo-electric actuators 10*a* and 10*b* from harm.

The foregoing description of one or more example embodiments has been presented for the purposes of illustration and description. It is not intended to be exhaustive or to limit the invention to the precise form disclosed. Many modifications and variations are possible in light of the above teaching. It is intended that the scope of the disclosure be limited not by this detailed description.

We claim:

1. A gesture detection system comprising:
   a button structure for mounting in an outer frame of a mobile device;
   a first piezo-electric actuator in contact with the button structure configured to generate a first varying electrical signal in response to a dynamic force application to the button structure;
   a second piezo-electric actuator in contact with the button structure configured to generate a second varying electrical signal in response to the dynamic force application to the button structure;
   a processor; and
   a first memory storing instructions that, when executed by the processor, are configured to:
   i) determine magnitude and position of the dynamic force application on the button structure over time, based on the first varying electrical signal and the second varying electrical signal, ii) determine a gesture corresponding to the magnitude and the position of the dynamic force application over time, wherein when the first varying electrical signal increases and the second varying electrical signal decreases, the processor is configured to determine that the gesture comprises a moving force application across the button structure; and iii) provide a response signal based on the gesture, wherein the response signal comprises a haptic activation signal to the first piezo-electric actuator and/or the second piezo-electric actuator for generating a haptic response thereon based on the gesture.

2. The system according to claim 1, wherein the position of the dynamic force application is determined based on a relative value of a magnitude of the first varying electrical signal and a magnitude of the second varying electrical signal.

3. The system according to claim 2, wherein when the magnitude of the first varying electrical signal is substantially equal to the magnitude of the second varying electrical signal, the processor is configured to determine that the gesture comprises a stationary force application in between the first piezo-electric actuator and the second piezo-electric actuator.

4. The system according to claim 2, wherein when the magnitude of the first varying electrical signal is greater than 2× the magnitude of the second varying electrical signal and a ratio therebetween is substantially constant, the processor is configured to determine that the gesture comprises a stationary force application over the first piezo-electric actuator.

5. The system according to claim 1, wherein the position of the dynamic force application is determined based on changes in the first varying electrical signal and the second varying electrical signal over time.

6. The system according to claim 1, wherein the processor is configured to determine a change in position of the dynamic force application on the button structure.

7. The system according to claim 6, wherein the change in position of the dynamic force application is determined based on a relative value of a magnitude of the first varying electrical signal and a relative magnitude of the second varying electrical signal over time.

8. The system according to claim 6, wherein the change in position of the dynamic force application is based on changes in the first varying electrical signal and the second varying electrical signal over time.

9. The system according to claim 1, wherein the response signal comprises a display activation signal for generating a response on a display of the mobile device based on the gesture.

10. The system according to claim 1, wherein the response signal comprises a volume activation signal for adjusting a volume of a speaker of the mobile device based on the gesture.

11. The system according to claim 1, wherein the memory includes a table of different force applications or gestures and corresponding response signals for access by the processor.

12. The system according to claim 1, wherein the button structure comprises:
a button extending externally through an opening in the outer frame, and internally into contact with both of the first piezo-electric actuator and the second piezo-electric actuator;
a projection extends outwardly from around an edge of the button with dimensions greater than the opening in the outer frame; and
a gasket mounted between the projection and the outer frame.

13. The system according to claim 12, wherein the gasket is comprised of a resilient material, and configured so that the gasket applies a force on the projection, thereby biasing the button into contact with the first piezo-electric actuator and the second piezo-electric actuator.

14. The system according to claim 1, wherein the button structure comprises:
a button formed in and integral with the outer frame, and extending internally into contact with both of the first piezo-electric actuator and the second piezo-electric actuator; and
hinges comprised of thinned sections in the outer frame form a living hinge.

15. The system according to claim 14, wherein the button structure includes a pin mounted at each end of the button, proximate to each hinge, in a hole with a larger diameter than the pin, whereby a gap is formed between the pins and an inner wall of the outer frame, so that each pin contacts the inner wall of the frame after a desired deflection to provide a hard stop against the inner wall of the frame.

16. The system according to claim 14, wherein the first piezo-electric actuator and the second piezo-electric actuator are mounted in a cavity in the outer frame; and
wherein the cavity extends on either side of the hinges, thereby decreasing a stiffness of the outer frame at the hinges.

17. The system according to claim 1, wherein the button structure comprises:
a button mounted over a cavity in the outer frame, and extending internally into contact with both of the first piezo-electric actuator and the second piezo-electric actuator; and
a resilient elastic member providing a limited hinge at opposite ends of the button comprising sealing gaskets extending between ends of the button and the outer frame.

18. A method of detecting a gesture in a system comprising a button structure for mounting in an outer frame of a mobile device; and first and second piezo-electric actuators in contact with the button structure configured to generate first and second varying electrical signals, respectively, in response to a dynamic force application to the button structure;
the method comprising:
i) determining magnitude and position of the dynamic force application on the button structure over time, based on the first varying electrical signal and the second varying electrical signal;
ii) determining a gesture corresponding to the magnitude and the position of the dynamic force application over time; and
iii) providing a response signal based on the gesture;
wherein when the first varying electrical signal increases from a first magnitude to a second greater magnitude and the second varying electrical signal decreases from a third magnitude to a fourth lesser magnitude, the gesture is determined to comprise a moving force application across the button structure.

19. A gesture detection system comprising:
a button structure for mounting in an outer frame of a mobile device;

a first piezo-electric actuator in contact with the button structure configured to generate a first varying electrical signal in response to a dynamic force application to the button structure;

a second piezo-electric actuator in contact with the button structure configured to generate a second varying electrical signal in response to the dynamic force application to the button structure;

a processor; and a first memory storing instructions that, when executed by the processor, are configured to:

i) determine magnitude and position of the dynamic force application on the button structure over time, based on the first varying electrical signal and the second varying electrical signal, wherein the position of the dynamic force application is determined based on a relative value of a magnitude of the first varying electrical signal and a magnitude of the second varying electrical signal;

ii) determine a gesture corresponding to the magnitude and the position of the dynamic force application over time, wherein when the first varying electrical signal increases and the second varying electrical signal decreases, the processor is configured to determine that the gesture comprises a moving force application across the button structure; and iii) provide a response signal based on the gesture.

* * * * *